United States Patent [19]

Sunthankar

[11] Patent Number: 5,366,764
[45] Date of Patent: Nov. 22, 1994

[54] ENVIRONMENTALLY SAFE METHODS AND APPARATUS FOR DEPOSITING AND/OR RECLAIMING A METAL OR SEMI-CONDUCTOR MATERIAL USING SUBLIMATION

[76] Inventor: Mandar B. Sunthankar, 1713 Hull St., Fort Collins, Colo. 80526

[21] Appl. No.: 898,577

[22] Filed: Jun. 15, 1992

[51] Int. Cl.$^5$ ............... B05D 3/06; C23C 16/00; C23C 14/24
[52] U.S. Cl. ............... 427/248.1; 427/250; 427/345; 427/561; 427/569; 427/576; 427/570
[58] Field of Search ............ 427/561, 562, 563, 564, 427/568, 569–580, 591–597, 248.1, 249, 250, 251, 252, 255, 255.1, 345

[56] References Cited

U.S. PATENT DOCUMENTS

| | | | |
|---|---|---|---|
| 1,710,747 | 4/1929 | Smith. | |
| 2,153,786 | 4/1939 | Alexander et al. | 91/12.2 |
| 2,723,204 | 11/1955 | Pottberg et al. | 117/24 |
| 3,329,601 | 7/1967 | Mattox | 204/298 |
| 3,432,335 | 3/1969 | Schiller et al. | 427/567 |
| 3,514,388 | 5/1970 | Brumfield et al. | |
| 3,517,644 | 6/1970 | Baer | 118/49 |
| 3,912,826 | 10/1975 | Kennedy | 427/566 |
| 3,926,147 | 12/1975 | Steube | 118/49.1 |
| 4,116,161 | 9/1978 | Steube | 118/49.1 |
| 4,139,509 | 2/1979 | Ingle et al. | 427/255 |
| 4,207,119 | 6/1980 | Tyan | 136/89 TF |
| 4,321,246 | 3/1982 | Sarma et al. | 427/578 |
| 4,464,422 | 8/1984 | Senda et al. | 427/124 |
| 4,505,947 | 3/1985 | Vukanoue et al. | 427/568 |
| 4,526,132 | 7/1985 | Ohta | 427/566 |
| 4,551,387 | 11/1985 | Manabe et al. | 428/336 |
| 4,619,844 | 10/1986 | Pierce et al. | 427/248.1 |
| 4,707,238 | 11/1987 | Okubo | 204/192 |
| 4,872,932 | 10/1989 | Yoshikawa et al. | 156/151 |
| 4,976,988 | 12/1990 | Honda | 427/566 |
| 4,978,588 | 12/1990 | Adaniya et al. | 204/192 |
| 5,028,452 | 7/1991 | Beatty | 427/571 |
| 5,032,421 | 7/1991 | Sarma et al. | 427/125 |
| 5,171,610 | 12/1992 | Lui | 427/252 |

OTHER PUBLICATIONS

The Use of Close Spacing in Chemical-Transport Systems for Growing Epitaxial Layers of Semiconductors; Journal of the Electrochemical Society; F. H. Nicoll; Nov. 1963; Princeton, N.J., vol. 110, No. 11; pp. 1165–1167.
IEEE; Progress Towards High Efficiency, Thin Film CdTe Solar Cells K. W. Mitchel, et al.; 1985; ARCO Solar, Inc.; pp. 1359–1364.
Corrosion Protection of High Strength Steels by Ion Plated Cadmium; I.A.M. Wilson; pp. 75–79 No date.
Solar Energy Research Institute; CuInSe and CdTe: Scale-up for Mfg.; K. Zweibel, et al; Dec. 1989; SERI for USDoE; pp. 67–83.

*Primary Examiner*—Marianne Padgett
*Attorney, Agent, or Firm*—Luke Santangelo

[57] ABSTRACT

This invention describes an environmentally and occupationally safer method and apparatus for coating and/or reclaiming materials in low pressure inert atmospheres. This invention is useful for coating a large number of irregularly shaped articles, such as industrial fasteners, tools and the like, with metals, semiconductor materials, composites, or alloys. The process related to this invention is also useful for coating parts in a rack or barrel type coating apparatus, as well as the continuous coating of parts which are fed through the path of material vapor streams. The processes and apparatus disclosed use sublimation techniques which allow almost unrestricted size, shape and placement of the depositing source. Heating sources serve to sublimate materials which can then be directed to the desired substrate for condensing. Additional heating sources may be provided to prevent vapors from condensing on chamber surfaces, or these heating sources may be used to periodically or continuously recover extraneously deposited material. In the reclamation mode, coated articles may be heated until sublimation of the coating occurs to allow the material to be reclaimed for safe disposal or reuse.

28 Claims, 7 Drawing Sheets

ENVIRONMENTALLY SAFE METHODS AND APPARATUS FOR DEPOSITING AND/OR RECLAIMING A METAL OR SEMI-CONDUCTOR MATERIAL USING SUBLIMATION

FIELD OF THE INVENTION

The present invention relates to methods and apparatus for sublimating a material in deposition and/or reclamation procedures. Specifically the present invention relates to environmentally safe methods and apparatus for performing material deposition and reclamation either simultaneously or independently of each other.

BACKGROUND OF THE INVENTION

Electroplating and mechanical plating are conventional methods used in large-scale economical coating of materials, such as heavy metals, alloys, metal compounds and composites on industrial components. Some of the materials which are plated in large quantities include metals such as zinc, cadmium and chromium; alloys such as zinc-cadmium, zinc-chromium of various compositions; compounds such as cadmium oxide, zinc sulphide, zinc-telluride and cadmium telluride; and composites such as zinc-carbon. Some of these materials are used as protective coatings to prevent early corrosion in various ambients. Others are used as lubricous coatings on fasteners. Cadmium-telluride, zinc-sulphide and zinc-telluride are semiconductor materials which are used in optoelectronic device applications. Cadmium oxide is used in Nickel-Cadmium batteries. Cadmium coating is preferred when protection in marine environments, as well as high lubricity, is of prime importance. Hard chromium is preferred when appearance, corrosion resistance and scratch protection is desired simultaneously. Zinc is used for plating fasteners and galvanizing steel rolls. Recently, zinc-cadmium alloys were found to be superior to cadmium in corrosion properties in all environments and are being substituted for cadmium to reduce the use of toxic cadmium. Zinc, cadmium and chromium are electroplated in the defense, aerospace and automobile industries on a large scale.

The conventional electroplating and mechanical plating methods can use large quantities of hazardous toxic chemicals such as cadmium, hexavalent chromium, sodium cyanide and chromic acid, and may discharge environmentally unacceptable effluent into the waste water streams. Large quantities of precipitated heavy metal sludge produced in these plating operations are usually disposed of at a selected number of government regulated land sites. Industrial electroplating waste has been reported to be the largest single source of contamination of the natural water streams in the United States. The U.S. Environmental Protection Agency (USEPA) and the U.S. Department of Defense (USDoD) are continuously seeking environmentally acceptable technologies which would minimize toxic waste generation at its origin. A key aspect of the present invention is its ability to provide an environmentally and occupationally safe plating method which eliminates liquid chemicals and minimizes waste.

A second problem encountered with prior art devices relates to the configuration of the source material. In this regard the present invention is distinctly different from conventional glow discharge plating or ion plating. In prior ion plating methods a metal is melted in a hot crucible or on a hot filament wire to generate coating vapors. This method is demonstrated in U.S. Pat. Nos. 4,116,161 to Steube and 3,329,601 to Mattox. Using a molten metal source places restrictions on the location, size, shape and the amount of the source available in the apparatus, and adds to the complexity of fixturing as well as cost of the apparatus. The complexity in molten source fixturing is increased as the area and/or the number of parts to be coated in a batch is increased and as the plating rate is increased. Through the present invention, these restrictions are either eliminated or substantially reduced. The added flexibility in source configuration allows for simplified, lower-cost technology for large scale manufacturing.

In addition, after a session of deposition the chamber is often left with a great deal of extraneous material deposited upon its surfaces. Some devices have sought to minimize this condition by directing the vaporized material toward the targeted surface. This technique is effective in deferring, not deterring extraneous deposition. Eventually, even deposition chambers using this directional process must be cleaned. In addition, regardless of the cleaning process, the recovered material is usually of a lesser quality due to impurities and such. The present invention offers two distinct approaches to address these chamber and recovery problems. One serves to prevent extraneous deposition, while the other is an almost effortless method for recovering any extraneously deposited material on chamber surfaces.

In the field of sublimation processes other problems have been known to exist. Indeed, sublimation of semiconductor materials has been used in the past, as evidenced by U.S. Pat. No. 4,207,119 to Tyan, for growing films on flat surfaces. However, this has been limited to close-space sublimation, or CSS. As the name implies, this process is useful only for flat substrates in close proximity to a flat source. This arrangement was found necessary to grow layers with suitable photovoltaic properties on the substrate. The high pressures at which CSS operates—500 milliTorr to 1 Torr—causes the deposited material to form clumpy, powder-like layers as the distance between the substrate and the source material increases. These type of layers possess poor photovoltaic properties, and poor adhesion qualities. Tyan teaches placing a limitation on the source to substrate distance as the square root of the smaller of the surface area, or preferably between 5 to 5 mm. This limited space does not of course allow for operation in a glow discharge mode, as taught by the present invention. Two articles, "The Use Of Close Spacing In Chemical Transport Systems For Growing Epitaxial Layers of Semiconductors", by F. H. Nicoll and "CuIn-$Se_2$ and CdTe: Scale-up For Manufacturing" by K. Zwiebel and R. Mitchell, discuss close-space sublimation in much greater detail, including many of the problems of CSS. The present invention eliminates the limitation of close spacing between the source and substrate. In addition, the present invention does not limit the size and shape of either source or substrate, as discussed earlier. Uniform coatings are possible with the present invention on in regular substrates, as well as flat substrates.

The present invention, in its various methods and apparatus, recognizes and addresses these and other problems and overcomes many limitations encountered by those skilled in the art. Many devices and procedures have taught the use of a molten source, but none have realized the advantages of a solid source material as in the present invention. Until the present invention, it has not been known to take the present approach of utilizing sublimating metal and semiconductor materials for plating processes in a glow discharge, despite the long felt need for environmentally and occupationally safe methods and apparatus, and the existence of the necessary implementing arts. Problems such as waste of source material exist in the field of vapor deposition, but such problems have not been adequately addressed by those skilled in the art. While material sublimation is a well known physical property of some elements and compositions, its value in the field of deposition has gone virtually unnoticed because those skilled in the art failed to address the aspects of adequate adherence, variable source configuration—size, placement, shape, etc.—and especially material waste control. The recognition by the present inventor that the problems encountered in conventional deposition could be solved by using sublimating materials lead to the present invention. The prior art has taught away from the present invention by stressing molten source reservoirs rather than solid source materials. Other areas of teaching away by the prior art relate to the methods of recovery. While prior art systems employ tedious scraping and cleaning techniques to rid the chamber of extraneous source material, the present invention again takes advantage of the sublimating property of certain materials to recover/reclaim a pure, reusable source. Rather than supplying a system which affords only an incremental increase in performance and design over the prior art, the present invention utilizes techniques which were not previously considered to achieve leaps in performance compared to the prior art.

SUMMARY OF THE INVENTION

The present invention discloses environmentally safe methods and apparatus for plating metal or semiconductor material onto a suitable substrate, such as used in industrial components and tools. The device provides a reliable and effective means for coating a substrate, while maintaining a safe working environment for the operator, and addressing environmental issues. This invention serves to enhance safety by trapping possible escaping toxic vapors, to promote material recovery by providing continuous and periodic reclamation means, and to solve source adherence and configuration problems by sublimating the metal and semiconductor material used in the deposition process.

In general terms, the invention involves various embodiments of a deposition method and apparatus. Many of the elements of this device achieve several different objects which, when combined, act to achieve the mentioned leaps in performance. In embodiments, the invention discloses either an anode or cathode type source plating apparatus in three configurations, rack, barrel, or continuous. Each type and configuration is capable of deposition, recovery/reclamation, or both processes to allow high volumes of articles to be acted upon. The disclosed devices may also feature additional heating means which prevent vaporized material from being deposited upon chamber surfaces without being re-sublimated. Still other embodiments include a means for the decomposition of carbon containing gases into their various constituents which allows for the realization of deposited compositions such as zinc-graphite, cadmium-graphite, etc.

While drawing from some of the important conditions demanded of these devices for providing an effective coating, the invention expands upon these conditions in an effort to provide an occupationally and environmentally safe device during deposition and reclamation processes, By recognizing and utilizing the advantages of material sublimation, and utilizing additional heaters for recovery and/or prevention of extraneously deposited material the present invention achieves its goals.

Accordingly, the present invention provides multiple embodiments of apparatus and methods which serve to deposit a sublimed source material of metal or semiconductor material onto desired suitable substrates. The stated additional heating means act to provide means for preventing deposition on chamber surfaces, as well as means for reclaiming extraneously deposited material. The chamber, in certain embodiments, may include a reclamation surface which may be used to condense vaporized material during the reclamation process. In addition, each of the disclosed configurations can be used as either an anode or cathode source deposition apparatus. To properly and uniformly coat and adhere the vaporized material a glow discharge mode may be used during the deposition process.

It is generally an object of the present invention to provide a method for coating a substrate with a metal or semiconductor material source using sublimation. It is an object that this process should not be limited by the placement of the substrate and source, as in close-space sublimation. It is also an object that this process should not be limited by the placement, size and shape of the source. As a solid configuration the source used in the present invention may take on a multitude of shapes, sizes, and positions with the chamber, most notably being large, thin sheets of material used to line the chamber wall surfaces.

It is another object of the present invention to provide a design which is both environmentally and occupationally safe. It is desirable that source waste, which has continued to be a dangerous environmentally toxic effluent, should be dramatically minimized, and harmful toxic cadmium emissions, which can poison unsuspecting operators, should be eliminated. By recovering extraneously deposited material from chamber surfaces—or preventing its deposition altogether—by permitting reclamation of deposited material from industrial articles, such as fasteners, tools and the like, and by using sublimation techniques, the multiple configurations and embodiments of the present invention accomplish waste minimization. By trapping and recovering escaping vapors the present invention accomplishes elimination of toxic emissions.

It is still another object of the present invention to provide a design which can coat substrates of irregular sizes and shapes. While deposition vapors can be directed towards target surfaces for deposition, the present invention additionally allows the sublimated vapors to be scattered by a glow discharge, and also allows material to be placed or emitted in a variety of locations, by contouring the source or having sources with divergent view angles to improve the uniformity of coating.

Naturally, further objects of the invention are disclosed throughout other areas of the specification and claims.

BRIEF DESCRIPTION OF THE DRAWINGS

The following descriptions and referenced drawings are for selected preferred embodiments of the present invention. Naturally, changes may be made to the disclosed embodiments while still falling within the scope and spirit of the present invention and the patent granted to its inventor.

DETAILED DESCRIPTION OF THE PREFERRED EMBODIMENTS

Figure 1:
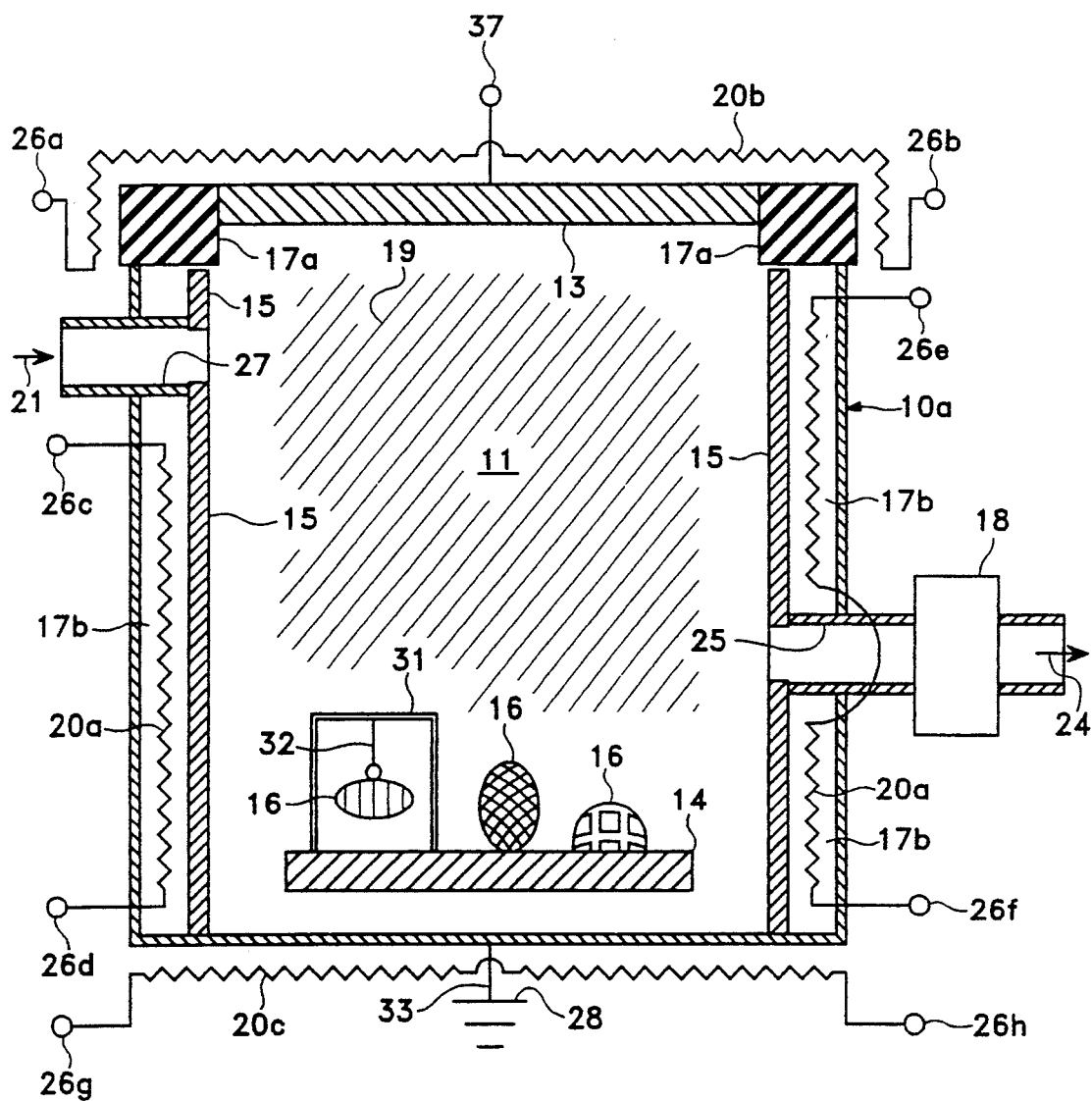
FIG. 1 is one embodiment of a typical cathode source rack plating apparatus using this invention.
Figure 2:
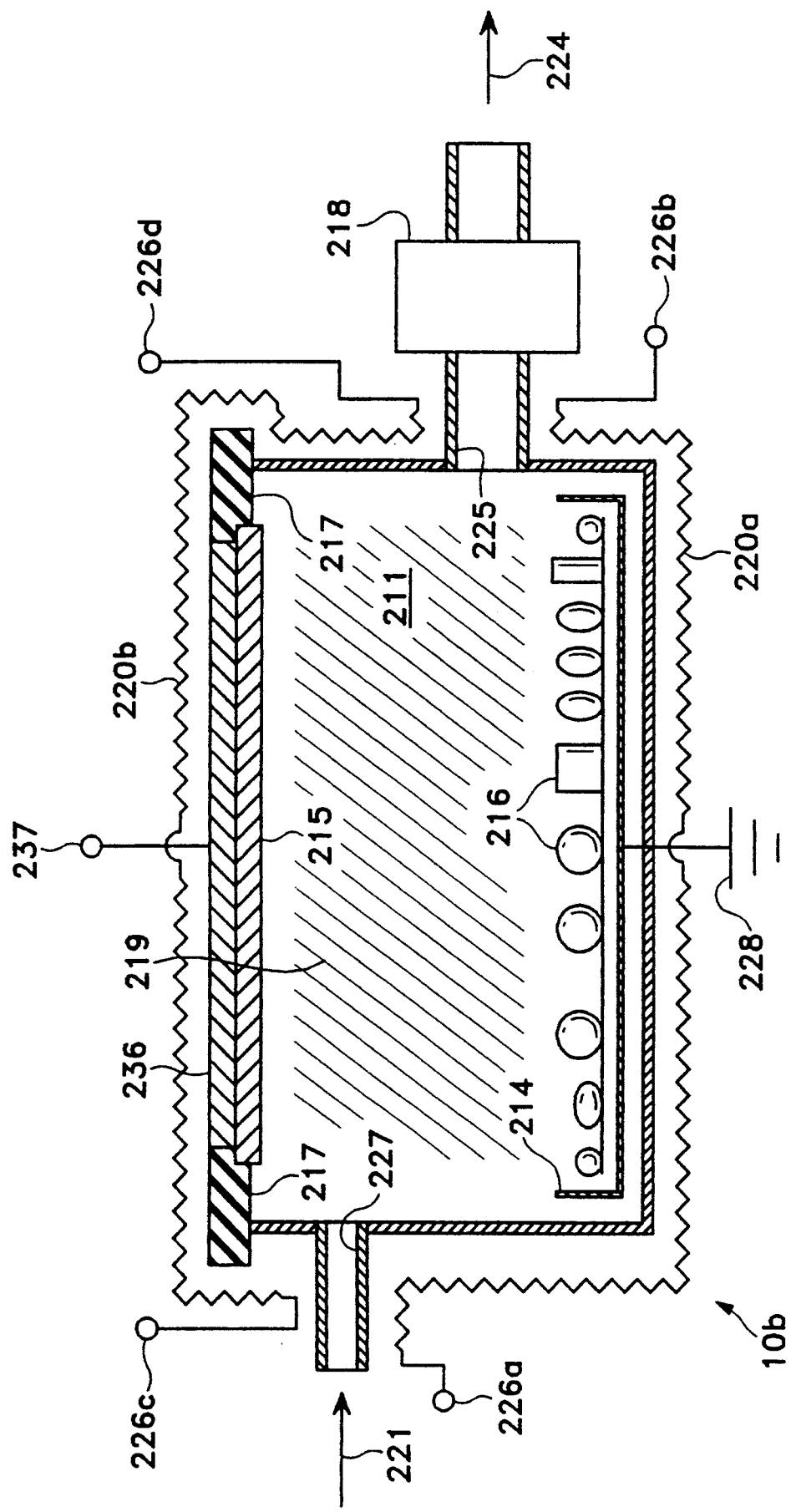
FIG. 2 is one embodiment of a typical anode source rack plating apparatus using this invention.
Figure 3:
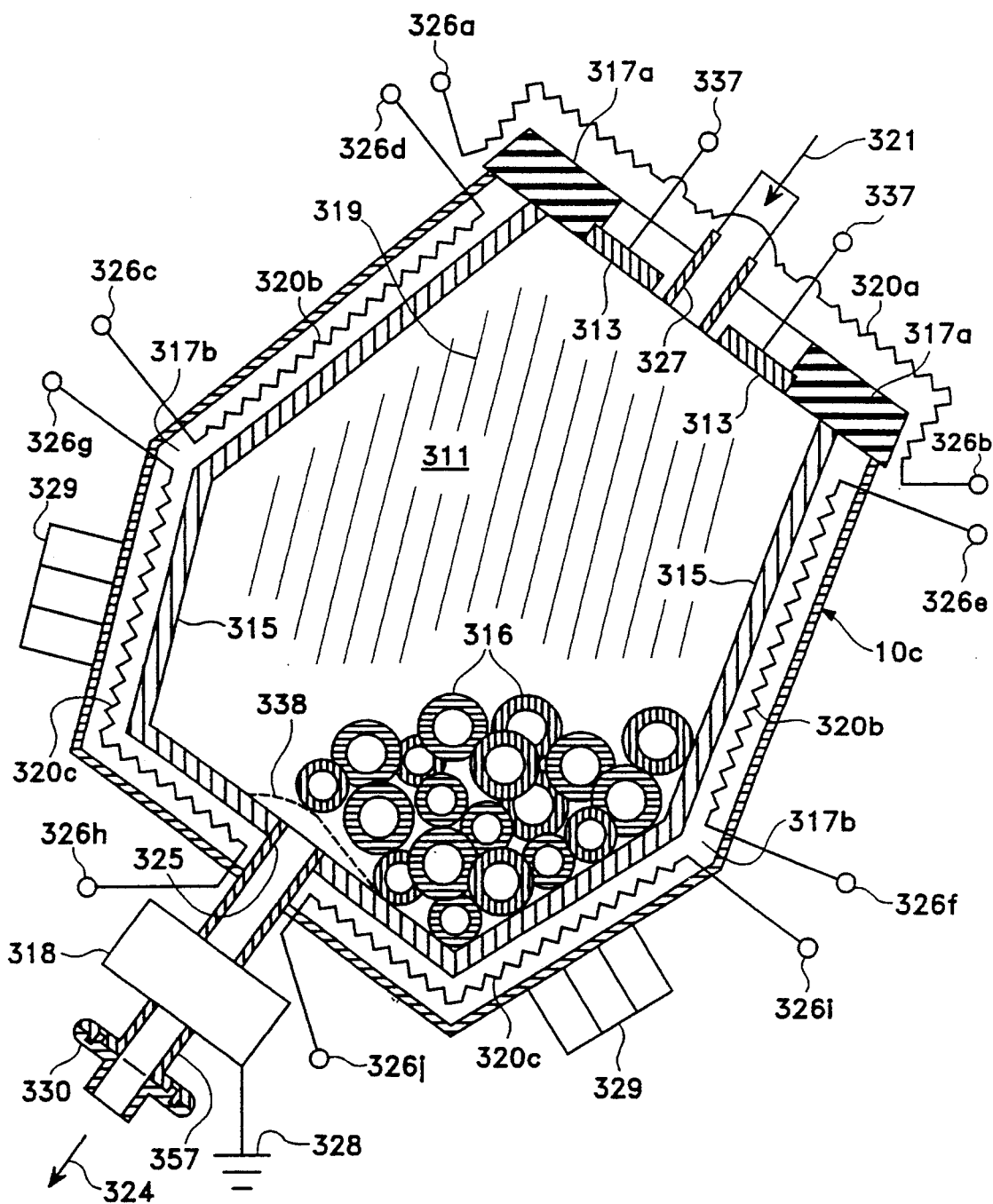
FIG. 3 is one embodiment of a typical cathode source barrel plating apparatus using this invention.
Figure 4:
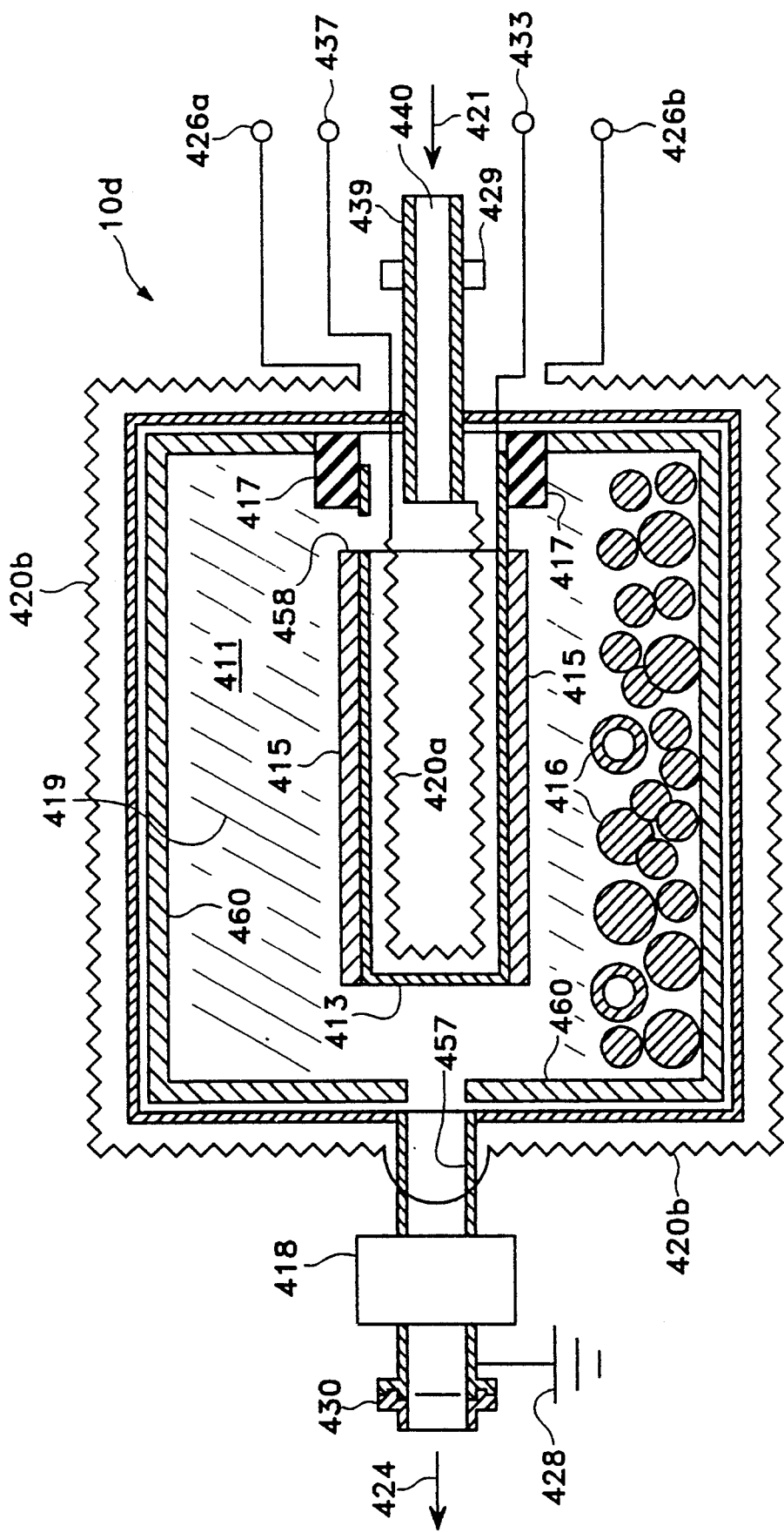
FIG. 4 is one embodiment of a typical anode source barrel plating apparatus using this invention.
Figure 5:
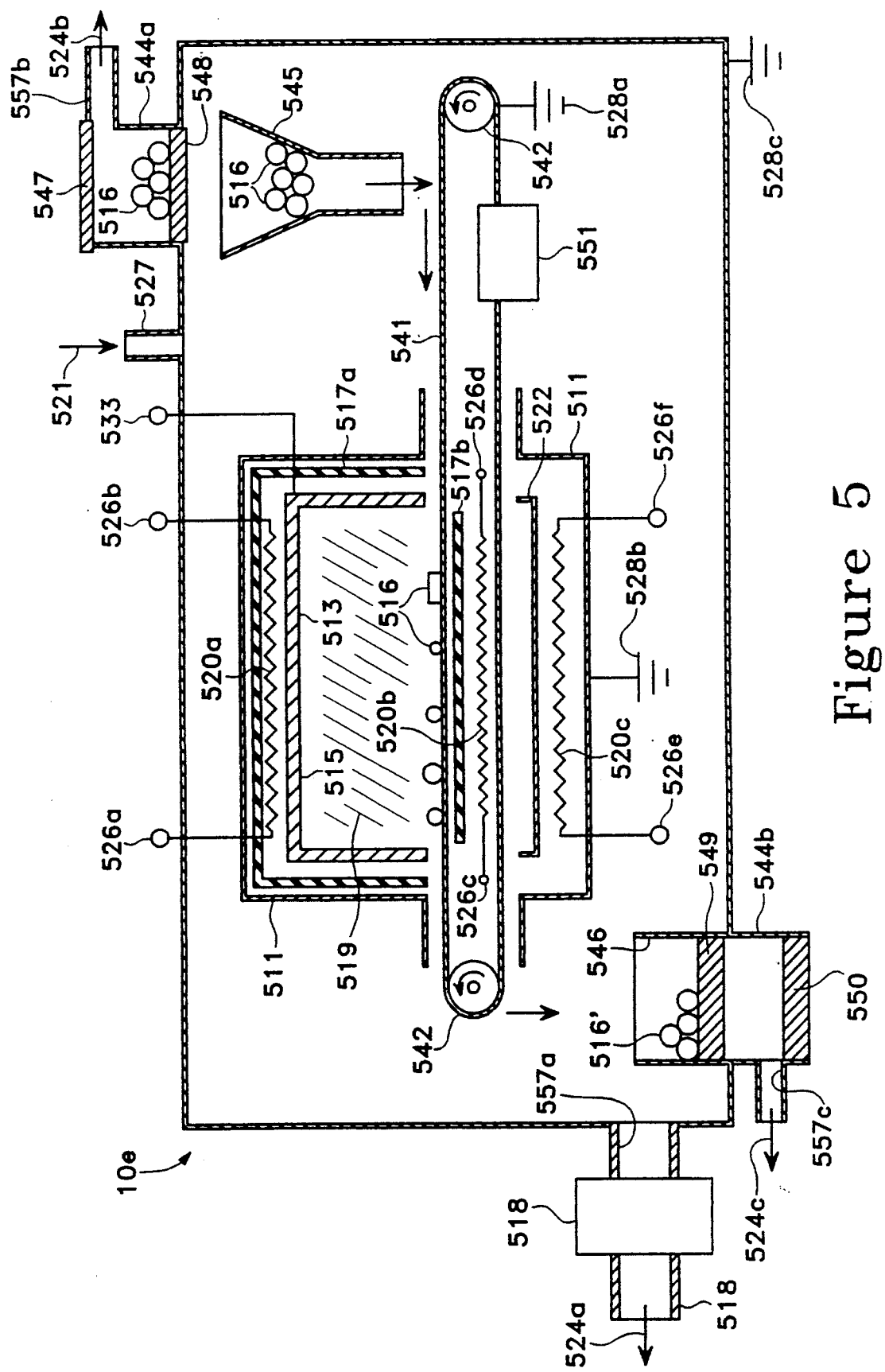
FIG. 5 is one embodiment of a typical anode source continuous sheet plating apparatus using this invention.
Figure 6:
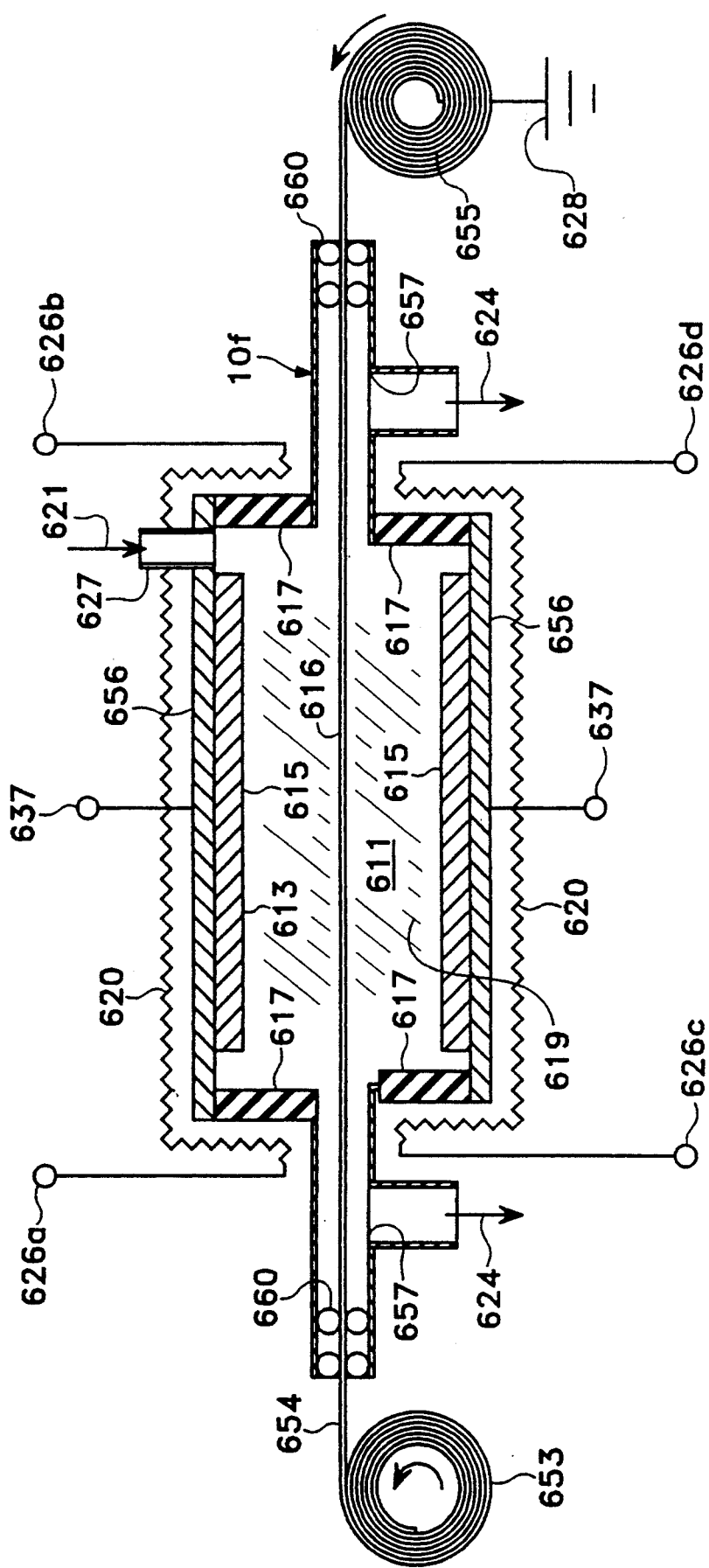
FIG. 6 is one embodiment of a typical anode source continuous sheet plating apparatus using this invention.

As can be seen in the various drawings, and as described in the following discussion, the present invention may be embodied in several different ways. Referring to the drawings, more particularly by reference numbers, rack plating apparatus (10a and 10b), as shown in FIGS. 1 and 2, is comprised of sealable chamber (11) having anode (13), cathode (14), source material (15), and substrate (16). FIGS. 3 through 6 show two different apparatus configurations, barrel plating apparatus (10c and 10d) and continuous plating apparatus (10e and 10f). Each of these three configurations may be designed as anode source devices, as shown in FIGS. 2, 4 and 6, or cathode source devices, as shown in FIGS. 1, 3 and 5. In addition, each device is capable of use in at least three distinct modes of operation, material deposition, material recovery/reclamation, and material deposition with continuous material recovery/reclamation.

Specific examples, measurements, and data resulting from research for the present invention is presented within U.S. Government Small Business Innovation Research Program proposal, granted under U.S. EPA Contract No. 68D10039. The specific information of this proposal, and others which may be supplementary, is hereby incorporated into this application by reference.

It is desirable to begin discussion, in general terms, with the process by which a material may be sublimated and then deposited upon a targeted substrate surface. The described invention is, of course, applicable to materials such as cadmium, zinc, chromium, tellurium, and others which can be sublimed at low pressure. That is, these materials may be vaporized directly from their solid state, in inert gas ambients at atmospheric pressures, as well as in a vacuum. Inert gases include not just those of noble character, but those that are non-reactive with the sublimating material. This vaporization may be accomplished by using resistance heating, heating with ion bombardment in glow discharge, induction heating or other means of raising the temperature of the source to the desired sublimation level. The method of this invention introduces vapors from subliming material source (15) into chamber (11), which operates at an inert gas pressure usually lower than the atmospheric pressure. The lower pressures help to catalyze the sublimation of source material (15) thereby catalyzing the recovery of waste as well. The inert gases which may be applicable in this process include argon, xenon, and others which do not chemically react with the vaporized materials to form undesirable nonvolatile compounds in the coating. Suitable sublimating metal, composite and semiconductor materials—such as, but not limited to zinc, cadmium, chromium, tellurium, magnesium, arsenic, antimony, strontium, samarium, manganese, beryllium, iron, palladium, zinc-cadmium, zinc-chromium, zinc-iron, zinc-telluride, cadmium-telluride, cadmium sulfide, zinc-cadmium-telluride, zinc sulfide, zinc oxide, cadmium oxide, zinc selenide, and gallium arsenide—as well as suitable inert gases can be found in most editions of the *Handbook of Chemistry and Physics*, published by CRC Press, as well as other known textbooks.

The deposition of source material (15) from these vapors onto substrate (16)—such as industrial fasteners, washers, tools, decorative articles, etc.—can be performed at pressures in the range from less than $10^{-5}$ Torr to a few Torr depending on the basic properties of source material (15). The sublimation of source (15) is independent of the distance between substrate (16) and source (15). As mentioned earlier, other sublimation processes require very close placement of substrate (16) and source (15) to effect suitable deposition. In operation, if chamber (11) is maintained at an inert gas pressure which ranges between a few milliTorr to a few Torr, a glow discharge can be initiated using suitable means such as a DC, AC, RF, or microwave power supplies or combinations thereof. These power supplies may be electrically connected to anode (13) and cathode (14), which are located inside deposition chamber (11), and operate within the range of 50 to 5000 volts, and preferably within 100 to 1000 volts. With the glow discharge sustained, source material (15) can be heated to its sublimation temperature, that is, a temperature at which significant sublimation occurs causing vaporization of the material. The vaporized material is then caused to condense upon the cooler substrate (16) located within chamber (11). In certain instances it may be desirable to direct the vaporized source toward substrate (16). This can be accomplished by such techniques as funneling, or others used by those skilled in the art. This operation is generally representative of the deposition process. Naturally, other cooler chamber surfaces may be deposited upon as well.

One aspect of the present invention addresses this wasteful and environmentally hazardous process by preventing deposition on chamber surfaces other than substrate (16). As the means for preventing deposition on these surfaces, each may be simultaneously heated to a temperature above that favorable to the condensing of the vaporized material. In this fashion such surfaces act as a secondary emission surface by re-vaporizing source material. In this instance, only substrate (16) would present a favorable surface for vapor deposition, and little material would be wasted. This represents the material deposition and continuous in situ recovery/reclamation mode of the present invention through which multidirectional deposition is achieved by orienting the secondary emission surfaces so as to both receive a portion of the vaporized source material and to re-vaporize and re-direct it toward the substrate from a divergent direction for desired deposition.

In addition to the deposition of source (15) onto substrate (16), and the prevention of deposition of extraneous material on chamber surfaces, embodiments of the present invention are also capable of in situ reclamation.

This process provides the means for minimizing waste of source material (15). Less waste is a key element of the present invention used to protect against environmental pollutants. The in situ reclamation or recovery of the materials which are condensed on chamber surfaces may be performed at low pressures in chamber (11) using re-sublimation of the materials from these surfaces. The means for sublimating extraneous material can be accomplished by raising the temperature of chamber surfaces using additional heating means such as ion bombardment from the glow discharge, resistance heating, induction heating and/or other known methods. As materials are re-vaporized they can be condensed on other surfaces, such as material source (15) and/or a reclamation surface located inside chamber (11), by maintaining such a surface at a temperature suitable for condensation. If the reclaimed material is condensed on source (15) itself, then the process of deposition will not be in operation because the temperature of source (15) will need to be maintained below the sublimation temperature. This is termed periodic recovery/reclamation. However, the in situ recycle of material from chamber surfaces with simultaneous deposition of source (15) on substrate (16) may be accomplished when the temperature of the targeted chamber surfaces is maintained high enough for re-sublimation, and that of substrate (16) is maintained below the sublimation temperature. In this case, source material (15) would only be permanently deposited on substrate (16). Deposition on any heatable surfaces could be re-sublimated during the deposition process so that such surfaces serve as one type of secondary emission surface. This is called continuous recovery/reclamation. The recovered materials which condense on the reclamation surface may be reused for the deposition process. This mode is also suitable for removing deposition layers from coated industrial articles, such as fasteners and the like. The coated articles would be placed in contact with a heating source such that the coating materials could be sublimated and then condensed on a reclamation surface. The detailed aspects of these three operational modes may be more clearly understood through discussion of each of the apparatus configurations, and with reference to the appropriate drawings.

Having now thoroughly discussed the methods of the present invention it is desirable to disclose the numerous apparatus by which these methods are accomplished. The following discussion, in conjunction with the referenced figures helps to illustrate the preferred embodiments of the present while some alternative elements have been listed for the purpose of indicating possible changes which may be made to particular embodiments, it would be impossible to list all alternatives in all instances. In such instances, any patent granted on the present invention is intended to cover various modifications and alternative designs, as such fall within the scope and spirit of the disclosed invention.

Figure 7:
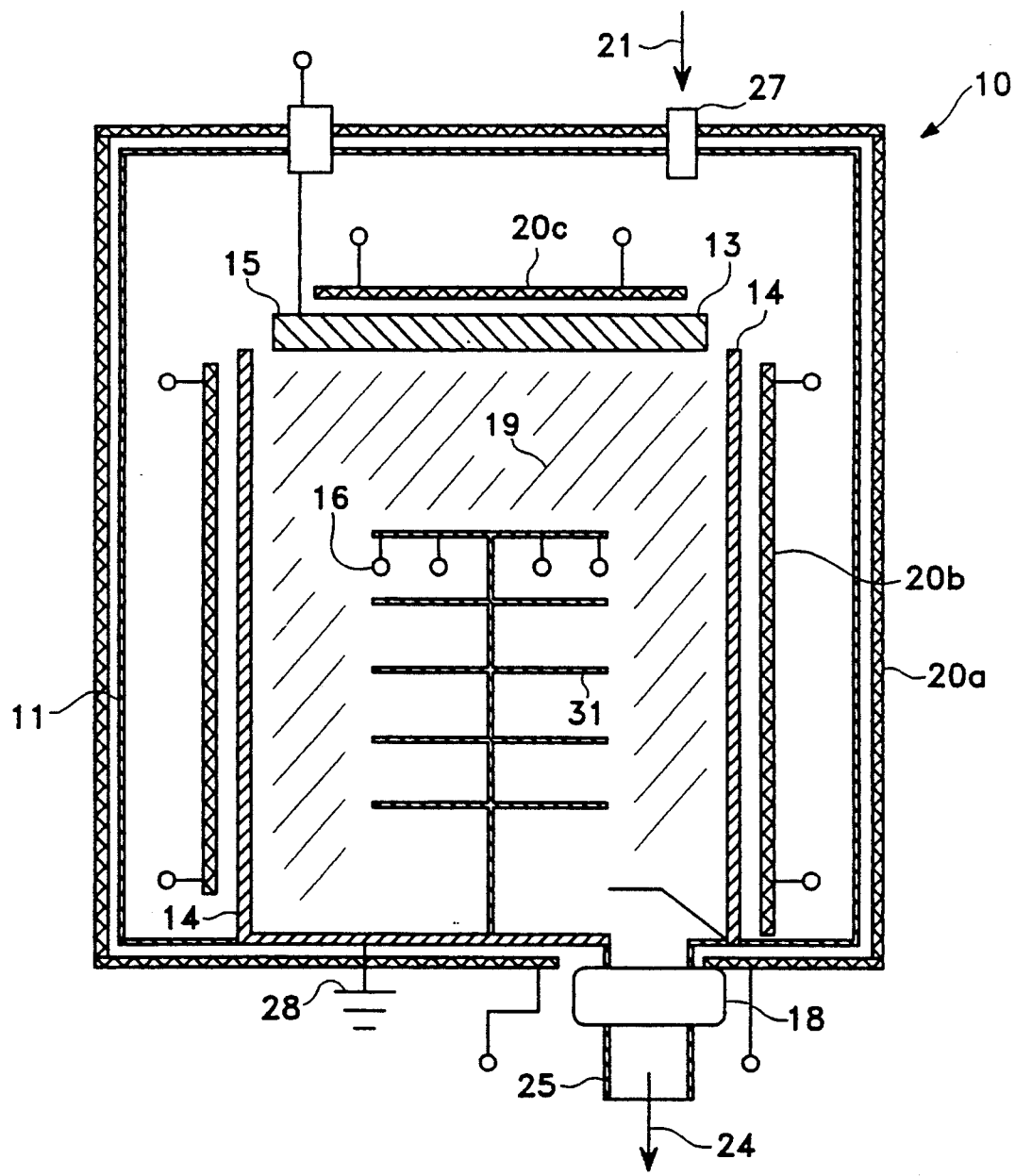
FIG. 7 is a schematic of an anode/cathode; source apparatus showing the general elements of the present invention.

In general terms, as shown in FIG. 7, the basic apparatus includes chamber (11) and substrate (16) (shown to have a contoured coating area by having either curved surfaces having more than one direction) which are preferably electrically connected to cathode (14), which may be grounded, while source (15) or another suitable electrode acts as anode (13). When sublimation source (15) is not anode (13), it is electrically connected to cathode (14) in one configuration of apparatus (10). The minimum distance of anode (13) with respect to cathode (14) will affect the glow discharge initiation and sustaining voltage for any of the aforementioned configurations. However, the distance between cathode (14) and anode (13) is preferably greater than the cathode dark space. A positive electrical potential which is sufficient to maintain glow discharge (19) between anode (13) and cathode (14) is applied to anode (13). When chamber (11) is used for substrate or chamber ion cleaning, then anode (13) and cathode (14) would be reversed in electrical polarity for at least a part of the plating cycle. A separate filament which is electrically heated using a suitable power supply can be located inside chamber (11) to facilitate ionization of inert gas (21). The glow discharge mode allows for improving the uniformity of the coating and the throwing power of the coating materials on substrate (16). In addition, the glow discharge mode allows for altering the physical properties and direction of the deposition material and improving the adhesion of the depositing material to substrate (16). The vaporized source is scattered as it passes through the plasma by atomic collisions. This allows substrates of peculiar shapes and configurations (e.g., having apertures) to be coated without rotation or any such manipulation of source (15) or substrate (16). The glow discharge phenomenon also provides a means for chemical dissociation of hydrocarbon gases, such as those having the general structure R—H, R—CH=CH—R', R—C≡C—R', or a benzene ring functional group (where R and R' are chains of carbon (C) and hydrogen (H) atoms), which would be nonreactive with some of the material vapors, such as those of zinc, and yet would introduce material particles, such as graphite, into the coating for composite coating formation, such as zinc-graphite. In addition, there may be applications for gases of the general form R—X (where X is a halogen atom), but due to the reactive nature of halides no such uses are currently known. All non-deposited constituents of the hydrocarbon gas could be removed from chamber (11). At present, experiments have been conducted using exclusively propane gas. There are, however, a countless number of gases which may be appropriately used for this process.

The present invention also allows for deposition of alloys of most any composition, as well as compounds. This may occur when vapors from subliming materials are simultaneously introduced in desired amount ratios in evacuated chamber (11), or at low inert gas pressures. For instance, Zn and Cd require a basic one to one ratio, and so equal weights of each may be independently sublimed to produce a net alloy coating of 50—50 Zn—Cd. The preferred embodiment allows for the generation of vapors from the subliming materials located inside a deposition portion of evacuated chamber (11). Alternatively, the vapors can be introduced into chamber (11) from external sources as well. Source material (15) to be vaporized may be of a variety of shapes, sizes and amounts to correspond with the substrate shape or deposition needs. For instance, source (15) may be configured as a sheet, a block, the wall lining of chamber (11), a cylinder, etc. As shown in FIG. 1, source (15) covers at least twice the coating area of substrate (16). This flexibility in vapor source design allows the present invention to be used in any of the previously mentioned configurations, each suitable for specific applications. For example, if the invention is to be applied in barrel plating, as demonstrated by barrel plating apparatus (10c or 10d), the barrel walls can be lined with coating source material (15), as shown in FIGS. 3 and 4. If this invention is applied in sheet metal plating, then source (15) can be in the form of a plate or block suitably located for efficient deposition. Each of these examples show how the surfaces can be shaped to correspond and thus have substantially duplicate structure. Large surface areas can be coated uniformly using large area source plates or sheets which are commercially available for metals such as cadmium and zinc. Different coating material sources can be located next to each other and sublimed simultaneously to form compounds or alloys, such as those of cadmium and zinc or zinc and tellurium. The rate of deposition of subliming source material (15) on substrate (16) is proportional to the temperature of source (15) for a given chamber pressure. For a constant chamber size, pressure and temperature below the melting point, the plating rate is proportional to the surface area of source (15). Coating source heating may not require electron beams, as with conventional methods. Continuous wire feeding into the molten source for replenishment is also eliminated. A relatively simple periodic replacement of source material (15) is adequate. Coating rates on the order of a few microns per minute may be obtained at temperatures well below the melting temperature of source material (15). The flexibility in coating source configuration, as well as flexibility in deposition rate makes the present invention versatile, productive and economical.

Remaining with FIG. 7, a general view of the present invention, one of the key aspects of this invention can be understood. Unlike designs of the prior art the present invention provides and maintains an occupationally safe plating environment. When used in the glow discharge mode, detectable toxic cadmium emissions from chamber (11) have been shown to be non-existent within the working atmosphere after deposition. This means for enhancing occupational safety is attributed to the inherent nature of the plating process which produces adherent and dense coatings. This means allows vapors escaping chamber (11) during deposition to be trapped using cold trap (18). Cold trap (18) prevents vacuum pump oil, when an oil pump is used, from getting contaminated and avoids hazardous waste disposal problems as well. Such problems exist when extraneous deposits must be manually removed from chamber surfaces and disposed of. With the present invention, any deposits from cold trap (18) can be reclaimed periodically, as described above, in most of the disclosed embodiments. Additionally, vacuum interlocks can be used to prevent accidental opening of chamber (11) during the plating operation. These interlock mechanisms, which are commercially available, are routinely incorporated into the conventional vacuum apparatus by the manufacturers.

Cathode source rack plating apparatus (10a), as shown in FIG. 1, shows that conductive anode (13) is electrically isolated from chamber (11) by using suitable insulator (17a). In addition, anode (13) may be connected to a suitable positive DC voltage bias, at terminal (37), which serves to sustain glow discharge (19) in chamber (11). The inert gas pressure within chamber (11) is preferably maintained in a range between a few milliTorr to a few Torr. In apparatus (10a) electrically conductive articles (substrates) (16), which are to be coated with subliming material, are placed onto electrically conductive cathode plate or rack (14). Substrate (16) is then in electrical contact with cathode (14). As an example of further useful application, suspension means such as metal rack (31) may be placed in contact with conductive cathode (14). Conductive substrate (16) may then be suspended from rack (31) using means such as hanger (32). Cathode (14) is electrically connected to chamber (11) by first connector (33), as shown in FIG. 1. Apparatus (10a), except anode (13), may be electrically grounded at ground (28).

A sheet and/or plate of subliming source material (15), such as zinc and/or cadmium, may be placed inside apparatus (10a) in a manner which prevents the accumulation of condensing source vapors on a large portion of chamber surfaces and recycles source material (15) during deposition. As shown, in this fashion each of the coating surfaces of substrate (16) are exposed to source material (15) over most of their solid view angles and thus may be deposited upon from many directions simultaneously. The chamber surfaces, referenced frequently throughout this text, may include those surfaces within deposition portion of chamber (11) other than substrate (16), and source (15). The manner of placement used in one embodiment of the present invention, as illustrated in FIG. 1, is to line or may compose the walls chamber (11) with sheets of source material (15). Source material (15) to cover almost the entire hemisphere view angle to which substrate (16) is exposed may be electrically conductive and electrically connected to chamber (11) so as to result in source (15) becoming a cathode source. For improving the uniformity of depositing material, cathode rack (14) may be rotated, or substrate (16) may be turned or vibrated using separate mechanisms attached to cathode (14).

Chamber (11) is fitted with gas inlet manifold (27) through which a pre-measured amount of inert gas (21), such as argon, is introduced continuously. This will maintain glow discharge (19) in chamber (11) for a given, applied, positive anode voltage. Chamber (11) may also be fitted with vacuum port (25). In turn, port (25) may be connected to vacuum pump system (24). Cold trap (18) is shown connected between port (25) and vacuum pump system (24). This arrangement allows any escaping material vapors—especially those of a toxic nature—to be trapped and prevented from reaching the outside of chamber (11).

Still referring to FIG. 1, resistance heater (20b) is connected to electrical power supply (not shown) via terminal pair (26a & 26b). Resistance heater (20b) is used to heat anode (13) as well as insulator (17a) sufficiently to prevent accumulation of subliming material vapors on insulator (17a) to cause it to act as a secondary emission source. Insulators (17a & 17b) must be kept at a temperature suitable for desirable re-sublimation to remain free of deposited extraneous material. Replaceable sections of source material (15) are heated to the desired sublimation temperature but below the melting temperature of source (15) using resistance heater (20a). In the present invention, the source material sections may be made of one subliming material for a single material deposit, such as zinc, or each section may be made of a different subliming material, such as zinc and cadmium for a zinc-cadmium alloy deposition. Resistance heater (20a) is electrically isolated from the walls of chamber (11) and source (15) by suitable insulator (17b). Each section of resistance heater (20a) is connected to a suitable electrical power supply (not shown) via terminal pairs (26c & 26d and 26e & 26f). Vapor deposition on remaining sections of the chamber surfaces may be prevented by heating those sections with resistance heater (20c). Heater (20c) is also connected to a suitable electrical power supply (also not shown) via terminal pair (26g & 26h).

To summarize the present embodiment, an inert gas glow discharge is maintained between anode (13) and cathode (14). Source (15) is heated to vaporization at a predetermined rate. The partially ionized, as well as neutral vapor atoms, then condense on substrate (16) to form a coating of source material. If the unwanted material deposits are to be reclaimed periodically from the chamber surfaces onto a recyclable means, such as at least one suitable metal sheet (not shown), then cathode source (15) may be replaced with the metal sheet(s). Heaters (20b & 20c) would then be activated to heat any deposits to the desired sublimation temperature. In this case, the sheet(s) which replaces cathode source (15) would not be heated. This, of course, allows the vapors to condense on the sheet(s). Similarly, the glow discharge with sufficiently high energy may be used to heal cathode rack (14) and coated articles (16) to be stripped of the coated subliming material (15). This aspect of the invention is useful for articles which can be heated to 100° C. to 400° C. in inert gas ambients without degrading desired physical properties of the articles Referring now to FIG. 2, anode source rack plating apparatus (10b) is very similar to that of cathode source rack plating apparatus (10a) of FIG. 1. Apparatus (10b) contains replaceable subliming material anode source (215) which is mounted on electrically conductive anode base plate (236). Base plate (236) is connected to a positive electrical DC voltage bias at terminal (237). The voltage should be suitable for sustaining glow discharge (219) in a low vacuum in apparatus (10b). Anode source (215) may be electrically isolated from the walls of chamber (211) using insulator (217). Substrate (216) may be placed on cathode rack (214) which may be rotated or vibrated as a suitable means for improving the uniformity of coating on substrate (216). Cathode rack (214) is shown electrically connected to apparatus (10b) which is electrically grounded at ground (228). Apparatus (10b) may be fitted with gas inlet manifold (227) for introducing a pre-measured amounted of inert gas (221), such as argon, continuously. This is done to maintain a desired pressure in apparatus (10b) for sustaining glow discharge (219) at a given anode voltage. Vacuum port (225) is connected to vacuum pump system (224) via could trap (218). When sufficiently heated, heater (220b) sublimes source material (215) for deposition on substrate (216). The function of cold trap (218) is identical to that stated previously for apparatus (10a). The recovery/reclamation system consists mainly of resistance heaters (220a–220b). Heaters (220a and 220b) are connected to a power supply via terminal pairs (226a & 226b, and 226c & 226d, respectively). When desired, glow discharge with sufficiently high energy can be used for heating cathode rack (214) to reclaim deposits of source material (215) onto cold anode source (215) or a recyclable sheet metal surface which may replace anode source (215).

Referring now to FIG. 3, cathode source barrel plating apparatus (10c) contains anode (313) which is electrically isolated from the wall of barrel chamber (311) using insulator (317a). A suitable positive DC bias voltage is applied to anode (313) at terminal (337). Resistance heater (320a) prevents accumulation of vapor deposits on anode (313) and insulator (317a) when heated. A suitable electrical power supply (not shown) is connected to heater (320a) at terminal pair (326a & 326b). The wall of barrel apparatus (10c), in this embodiment, is lined with or may be composed of a replaceable sheet or plate of subliming source material (315) such as cadmium and/or zinc. Material (315) is kept in electrical contact with barrel apparatus (10c). Barrel apparatus (10c) is suitable for plating a large number of electrically conductive substrates (316) under a low vacuum glow discharge. Barrel apparatus (10c) may be electrically grounded at ground (328). Gas inlet manifold (327) is shown to be axially mounted on barrel apparatus (10c) for continuously introducing pre-measured quantities of inert gas (321) so as to sustain glow discharge (319) at a given anode voltage. In addition, barrel apparatus (10c) is supported by mechanical gear (329) and rotary vacuum seal (330). Barrel apparatus (10c) may be rotated thus moving source material (315) during at least a part of the plating cycle by gear (329) which is connected to an external drive mechanism. Metal screen (338) covers vacuum port (325) so that substrate (316) is prevented from falling into vacuum manifold (357). Manifold (357) is connected to vacuum pump system (324) via cold trap (318). Vacuum manifold (357) is axially mounted on barrel apparatus (10c). A rotary vacuum seal (330) separates manifold (357) and vacuum pump system (324). Sections of resistance heaters (320b & 320c) may be electrically isolated from barrel apparatus (10c) and source (315) using insulator (317). Heater (320b) heats upper portion of source (315) for sublimation. Heater (320c) may be turned off during the plating cycle and used only for material reclamation. Sections of heater (320b) may be connected to a suitable electrical heating power supply (not shown) via terminal pairs (326c & 326d, and 326e & 326f, respectively), while sections of heater (320c) may be connected to a power supply via terminals (326g & 326h, and 326i & 326j). During periodic reclamation, heater (320b) is turned off and upper portion of source (315) may become a vapor condenser. Heater (320c) is heated to the necessary re-sublimation temperature for removal of excess material deposits from lower portion of cathode (316). Simultaneously, heater (320a) is heated to prevent accumulation of vapor deposits on anode (313) and insulator (317).

Another embodiment of the present invention is shown in FIG. 4. Anode source barrel plating apparatus (10d) is very similar in design to apparatus (10c). Apparatus (10d) is supported by mechanical gear (429) and rotary vacuum seal (430). Source (415) may be made into a replaceable sheet or plate of subliming material. Source (415) is shown mounted on electrically conductive anode cylinder (413) with gas outlet port (458). Anode (413) and source (415) are electrically isolated from barrel apparatus (10d) using insulator (417). Anode (413) is also shown connected to a suitable positive DC voltage bias via connector (433). The walls of barrel apparatus (10d) may be lined with or may be composed of metal sheet (460) made of the same material as source (415) or a suitable recyclable metal foil. The sheet should be in close contact with barrel apparatus (10d) for efficient heat transfer. Barrel apparatus (10d) may be suitable for plating a large number of electrically conductive substrates (416). In operation, barrel apparatus (10d) is loaded with substrates (416) to a level which is preferably the equivalent of at least one cathode dark space away from anode (413) as well as source (415). Cylindrical shaft (439) and vacuum manifold (457) may be mounted axially on barrel apparatus (10d). Open end (440) of shaft (439) receives a pre-measured amount of inert gas (421) continuously, so as to sustain glow discharge (419) in barrel apparatus (10d) for a given anode voltage.

Open end (440) of shaft (439) facilitates the flow of inert gas (421) to port (458) for release into chamber (411). Gear (429) is attached to shaft (439) for rotating barrel apparatus (10d) by means of an external drive mechanism thus moving source (415). Vacuum manifold (457) is connected to vacuum pump system (424) via cold trap (418). Rotary vacuum seal (430) is mounted on manifold (457). Barrel apparatus (10d) is electrically grounded at ground (428). Anode (413), source (415), and insulator (417) may be heated as desired by resistance heater (420a) to sublime source (415) and prevent accumulation of vapor deposit on insulator (417). The electrical heating power supply for heater (420a) may be connected between terminal (437) and ground (428). Resistance heater (420b) may heat the walls of barrel apparatus (10d) and insulator (417) during the reclamation cycle. Heater (420b), connected to a power supply (not shown) at terminal pair (426a & 426b), can be used periodically for reclaiming material deposited onto the walls of chamber (411). The material is thus re-sublimated and condensed onto source (415), or a suitable reclamation surface (not shown) which may replace source (415) for reclaiming only.

The remaining two embodiments relate to continuous plating apparatus (10e and 10f), anode sources. FIG. 5 shows anode source continuous plating apparatus (10e) which is suitable for continuous plating electrically conductive substrates (516) moving on an electrically conductive belt (541). Similar to the previous embodiments, plating can be accomplished in a lower pressure glow discharge. Electrically conductive deposition chamber (511) is enclosed inside evacuated apparatus (10e). Anode source (515), preferably made of a metal or semiconductor material, such as zinc and/or cadmium, may be electrically isolated from chamber (511) by means of insulator (517a). Anode source (515) is connected to a suitable power supply (not shown) via connector (533) so as to sustain glow discharge (519) in chamber (511). Resistance heater (520a) supplies heat as required to sublime anode source (515). Heater (520a) may supply necessary electrical power via terminal pair (526a & 526b). Electrically conductive belt (541) is run at a predetermined speed using metal pulleys (542) which may be grounded at ground (528a) thus moving substrate (516). Similarly, chamber (511) and apparatus (10e) may be electrically grounded at ground (528b and 528c, respectively). Apparatus (10e) is evacuated via vacuum manifold (557a) which is connected to vacuum pump system (524a) via cold trap (518). A controlled amount of inert gas (521) such as argon is continuously introduced at gas inlet manifold (527) so as to maintain a desired vacuum level for glow discharge in chamber (511). Continuous feeding mechanism (543) for substrate (516) consists of load-lock system (544a) and hopper (545). Periodic removal of plated articles is accomplished by bin (546) and load-lock system (544b). Substrates (516) are loaded in load-lock system (544a) and vacuum sealed lid (547) is shut. Vacuum pump (524b) is then used to evacuate load-lock system (544a) through vacuum manifold (557b), preferably to the pressure level in apparatus (10e). Vacuum sealed door (548) is then opened using any known automated means, and substrates (516) are gravity fed to hopper (545). Door (548) is then shut and hopper (545) loads pre-regulated quantities of substrates (516) continuously onto belt (541). As substrate articles (516) pass through the vapor stream in glow discharge (519) under anode (513), substrate articles (516) are plated. At the end of belt (541), plated substrate articles (516) may be collected continuously in bin (546). Periodically, load-lock system (544b) is evacuated by vacuum pump (524c) through operation of vacuum manifold (557c). A second vacuum sealed door (549) is then opened, and using an automated means plated substrate articles (516') are fed into load-lock system (544b). Second door (549) is shut and plated substrate articles (516') may then be removed from load-lock system (544b) by opening lower vacuum sealed door (550). Subliming vapor material from source (515) deposited on belt (541) may be reclaimed continuously or periodically using resistance heater (520b). Heater (520b) heats belt (541) to re-sublime deposits and condenses these vapors on reclamation surface (522). Thermal insulator (517b) sufficiently blocks heat transfer from heater (520b) to the section of belt (541) above heater (520b) to keep the temperature of belt (541) acceptable for plating operation. A suitable electrical power supply (not shown) is connected to terminal pair (526c & 526d) to activate and run heater (520b). After material re-sublimation, belt (541) may be cooled to a temperature level which is acceptable for plating operations using belt cooling system (551). Optional resistance heater (520c) may be used periodically to heat and re-sublime condensed material on reclamation surface (522) so that it may be deposited back onto source (515). This can be done, in the present embodiment, if belt (541), heater (520b), and insulator (517b) are removed. A suitable electrical heating power supply for heater (520c) may be connected between terminal pair (526e & 526f).

Finally, referring to FIG. 6, anode source continuous sheet plating apparatus (10f) is fitted with suitable air-to-vacuum seals (660) for feeding sheet metal into apparatus (10f). Sheet metal roll spool (653) is attached to automated mechanism (not shown) to draw plated sheet metal (654) out of chamber (611) at a predetermined transverse rate. Conductive spool (655) supplies sheet metal for plating and is electrically grounded at ground (628). Vacuum pump system (624) evacuates apparatus (10f) via vacuum manifold (657). A suitable inert gas (621) may be continuously introduced in pre-measured amounts through gas inlet manifold (627). In this embodiment, anode source plate (615) is made of any desirable subliming material, such as zinc and/or cadmium. Anode source plate (615) is preferably mounted on, and is in close contact with wall section (656) of apparatus (10f) for efficient heat transfer. Anode source (615) is connected to a suitable power supply (not shown) at terminal (637) to sustain glow discharge (619). Anode source (615) and wall section (656) are electrically insulated from apparatus (10f) using insulator (617). During plating, resistance heater (620), which is electrically insulated from wall section (656), is heated to raise the temperature of anode (613) sufficiently to obtain the desired sublimation rate. Heater (620) also helps to prevent deposition of sublimed vapors onto insulator (617). Heater (620) is connected to a suitable electrical power supply (not shown) at terminal pairs (626a & 626b, and 626c & 626d). During plating, material vapors sublimated from anode (613) are deposited onto substrate (616) in glow discharge (619).

The foregoing discussion and the claims which follow describe the preferred embodiments of the present invention. Particularly with respect to the claims, it should be understood that changes may be made without departing from its essence. In this regard, it is intended that such changes would still fall within The scope of the present invention. It simply is not practical to describe and claim all possible revisions to the present invention which may be accomplished. To the extent such revisions utilize the essence of the present invention, each would naturally fall within the breadth of protection encompassed by this patent. This is particularly true for the present invention since its basic concepts and understandings are fundamental in nature and can be broadly applied.

I claim:

1. A method for depositing a material onto at least one substrate within a chamber comprising the steps of:
   a. providing at least one substrate within said chamber;
   b. providing at least one source material within said chamber
   c. providing a secondary emission surface within said chamber;
   d. heating said source material;
   e. vaporizing said source material to create a vaporized source material;
   f. depositing a portion of said vaporized source material on said secondary emission surface;
   g. heating said secondary emission surface to a temperature at which re-vaporization of said originally vaporized source material occurs;
   h. re-emitting said deposited source material from said secondary emission surface; and
   i. depositing said re-emitted source material onto said substrate.

2. A method for depositing material as described in claim 1 wherein said step of heating said source material is to a temperature less than its melting temperature and further comprising the step of shaping said source material to accommodate a simultaneous, multidirectional deposition upon said substrate.

3. A method for depositing material as described in claim 1 or 2 wherein said step of providing at least one source material within said chamber comprises the step of providing at least two sources of material within said chamber and wherein said sources of material have divergent view angles with respect to said substrate.

4. A method for depositing material as described in claim 1 or 2 wherein
   said secondary emission surface is positioned to receive at least a portion of said vaporized source material from said source material and to have a divergent view angle with respect to said substrate.

5. A method for depositing material as described in claim 1 wherein said substrate has a coating area which is exposed throughout a solid view angle and wherein said source material has a sublimation area which substantially covers said solid view angle.

6. A method for depositing material as described in claim 1 wherein said chamber has chamber walls and wherein said chamber walls are substantially covered by said source material.

7. A method for depositing material as described in claim 4 wherein said chamber has chamber walls and wherein said source material and said secondary emission surface substantially cover said chamber walls.

8. A method for depositing material as described in claim 2 wherein said substrate has a contoured coating area, wherein said source material has a sublimation area, and wherein said sublimation area and said contoured coating area have substantially duplicate structure.

9. A method for depositing material as described in claim 8 wherein said contoured coating area is cylindrically shaped and wherein said sublimation area is cylindrically shaped.

10. A method for depositing material as described in claim 4 wherein said substrate has a contoured coating area, wherein said secondary emission surface has an emission area, and wherein said emission area and said contoured coating area have substantially duplicate structure.

11. A method for depositing material as described in claim 1 wherein said substrate has a coating area, wherein said source material has a sublimation area, and wherein said sublimation area is larger than said coating area.

12. A method for depositing material as described in claim 1 wherein said substrate has a coating area, wherein said source material has a sublimation area, and wherein said sublimation area is at least twice the area of said coating area.

13. A method for depositing material as described in claim 1 wherein said chamber has a chamber] wall area and wherein said source material has a sublimation area, and wherein said sublimation area is at least as large as said chamber wall area.

14. A method for depositing material as described in claim 4 wherein said chamber has a chamber] wall area, wherein said source material has a sublimation area, wherein said secondary emission surface has an emission area, and wherein said sublimation area and said emission area are at least as large as said chamber wall area.

15. A method for depositing material as described in claim 4 wherein said source material has a sublimation area and wherein said secondary emission surface has an emission area and wherein said sublimation area is larger than said emission area.

16. A method for depositing material as described in claim 4 wherein said source material has a sublimation area and wherein said secondary emission surface has an emission area and wherein said emission area is larger than said sublimation area.

17. A method for depositing material as described in claim 1 and further comprising the step of maintaining said substrate stationary during said step of depositing.

18. A method for depositing material as described in claim 17 and further comprising the step of moving said source material during said step of depositing.

19. A method for depositing material as described in claim 17 and further comprising the step of maintaining said source material stationary during said step of depositing.

20. A method for depositing material as described in claim 4 and further comprising the step of moving said secondary emission surface during said step of depositing.

21. A method for depositing material as described in claim 19 wherein said substrate has a plurality of coating surfaces and wherein said step of depositing is achieved simultaneously for each coating surface.

22. A method for depositing a material onto at least one substrate within a chamber comprising the steps of:
   a. providing at least one substrate within said chamber;

b. providing at least one solid source material within said chamber wherein said source material has a melting temperature;

c. providing at least one secondary emission surface within said chamber wherein said secondary emission surface is oriented toward said substrate;

d. establishing a pressure below atmospheric pressure within said chamber at which said source material efficiently sublimates;

e. heating said source material to a temperature less than its melting temperature;

f. sublimating said source material to create a vaporized source material;

g. depositing a portion of said vaporized source material on said secondary emission surface;

h. heating said secondary emission surface to a temperature at which re-vaporization of said originally vaporized source material occurs;

i. re-emitting said deposited source material from said secondary emission surface; and j. depositing said re-emitted source material onto said substrate.

23. A method for depositing material as described in claim 22 wherein said secondary emission surface receives vaporized source material at a rate of accumulation and wherein said step of re-emitting said deposited source material from said secondary emission surface is at a rate of re-emission and further comprising the step of establishing said rate of re-emission as at least as great as said rate of accumulation.

24. A method for depositing material as described in claim 23 wherein said step of establishing said rate of emission as at least as great as said rate of accumulation comprises the step of controlling the temperature of said secondary emission surface.

25. A method for depositing material as described in claim 23 wherein said step of establishing said rate of emission as at least as great as said rate of accumulation comprises the step of orienting said secondary emission surface.

26. A method for depositing material as described in claim 24 wherein said temperature of said secondary source causes sublimation.

27. A method for depositing material as described in claim 22 and further comprising the step of orienting said source material and at least one of said secondary emission surfaces to achieve multidirectional deposition.

28. A method for depositing material as described in claim 22 wherein said substrate has a contoured coating area, wherein said source material has a sublimation area, and wherein said secondary emission surface has an emission area, and wherein said contoured coating area, said sublimation area, and said emission area are cylindrically shaped.

* * * * *